SWITCHINC TYPE FM DETECTOR

Filed June 7, 1965

INVENTOR
Peter H. Van Anrooy

BY Hofgren, Wegner, Allen, Stellman & McCord

ATTORNEYS

United States Patent Office 3,413,560
Patented Nov. 26, 1968

3,413,560

SWITCHING TYPE FM DETECTOR

Peter H. Van Anrooy, Syracuse, N.Y., assignor to Warwick Electronics Inc., a corporation of Delaware Filed June 7, 1965, Ser. No. 461,838
5 Claims. (Cl. 329—103)

ABSTRACT OF THE DISCLOSURE

An FM detector transistor connected in series with a parallel tuned circuit and a source of DC energy is driven into saturation for a portion of each cycle of an incoming FM signal to switch the DC energy across the tuned circuit. A signal having an amplitude proportional to the frequency of the FM signal is generated in the series circuit and is integrated to produce an audio output signal.

This invention relates to an FM detector, and more particularly to an FM detector using a switching device.

Various demodulators for recovering the information contained in a frequency modulated signal are known in the art. Prior circuits of this nature have been of complex design, as an oscillating type detector. Non-oscillating detectors have similarly required complex circuitry when the frequency modulated information is to be accurately reproduced. In addition, such detectors often attenuate the FM signal information, or fail to provide any limiting action.

In accordance with the present invention, an FM detector circuit of simplified design is provided utilizing only a single switching device or electron valve, as a transistor. This circuit is inherently self limiting, and in addition provides amplification of the demodulated audio output signal.

A principal object of this invention is the provision of an FM detector circuit of improved design.

Another object of this invention is the provision of an FM detector using a single switching device.

One feature of this invention is the provision of an FM detector circuit including a parallel tuned circuit and a switching device in series with a source of DC energy. The incoming FM signal causes the DC energy to be periodically switched across the tuned circuit at a rate related to the resonance of the parallel tuned circuit, producing in the series circuit a signal whose value varies as the intelligence contained in the FM signal.

Another feature of this invention is the provision of a self-limiting detector circuit which provides amplification of the output signal and uses a single switching transistor.

Yet another feature of this invention is the provision of an FM detector which switches pulses of DC energy across a tuned circuit having a resonant response to the pulses with a peak and a substantially linear frequency response slope extending therefrom. An absorption trap may be coupled to the tuned circuit to improve the linearity of the slope.

Still another feature of this invention is the provision of an FM detector having a series connected load impedance and tuned circuit. An integrator is connected with the tuned circuit to produce the detected audio signal output.

A still further feature of this invention is the provision of an FM detector circuit using a switching device having two modes of conduction.

Further features and advantages of the invention will be apparent from the following specification and from the drawings, in which.

Figure 1:
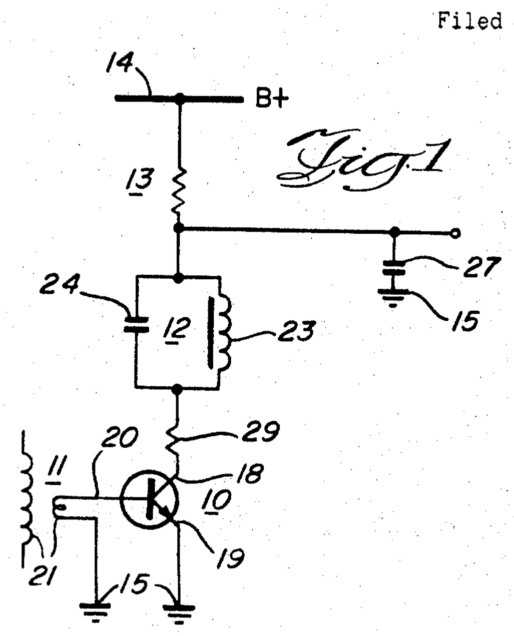
FIGURE 1 is a schematic diagram of an embodiment of the invention.

While illustrative embodiments of the invention are shown in the drawings and will be described in detail herein, the invention is susceptible of embodiment in several different forms, and it should be understood that the present disclosure is to be considered as an exemplification of the principles of the invention and is not intended to limit the invention to the embodiments illustrated. Throughout the specification, values and type designations will be given for the components in order to disclose a complete, operative embodiment of the invention. However, it should be understood that such values and types are merely representative and are not critical unless specifically so stated. Variations will be apparent to those skilled in the art. The scope of the invention will be pointed out in the appended claims.

Turning now to FIGURE 1, the FM detector circuit includes a switching device 10 connected to a source 11 of frequency modulated signal to be detected. Device 10 switches a tuned circuit 12 and a series connected load impedance 13 across a source of DC potential (not shown) connected with line 14 and ground or reference potential 15. The source 11 may be the tuner and intermediate frequency amplifier of a radio or television receiver, for example.

Switching device 10 may be a transistor, as type 2N706, having a collector electrode 18, an emitter electrode 19, and a base control electrode 20. A transformer 21 couples source 11 to the emitter 19 and base 20 electrodes. By way of example, it will be assumed that the FM signal has a carrier frequency of 4.5 megacycles modulated by an intelligence varying signal to cause a frequency deviation of less than 100 kilocycles on each side of the carrier frequency.

Tuned circuit 12 is comprised of an inductor 23 and capacitor 24 parallel resonant at a frequency outside the deviation of the signal, as 4.4 megacycles.

The FM signal applied to the base 20 causes the transistor to be rapidly switched from saturation to cutoff at the rate of the FM signal, i.e., during one portion of the cycle the transistor is driven "on," and during the other portion of the cycle the transistor is driven "off." As a result, essentially square wave current pulses at the frequency of the FM signal are switched through the collector 18 and emitter 19 electrodes of the transistor and to the tuned circuit 12 and load 13.

The impedance of tuned circuit 12 depends on the switching frequency. Since the current pulse switched by the transistor has a constant amplitude, the peak voltage at collector 18 is proportional to the impedance of the tuned circuit. Thus, load 13 of constant impedance and tuned circuit 12 form a frequency dependent voltage divider.

Figure 2:
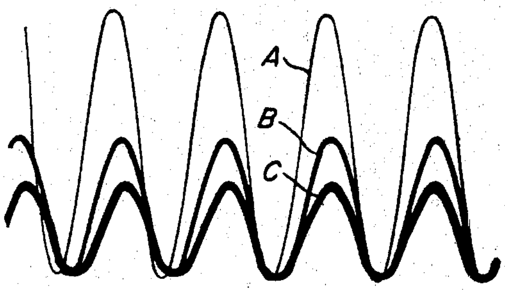
FIGURE 2 is a diagram of various waveforms at the collector electrode as the frequency of the incoming FM signal is varied.

Collector voltage waveforms are illustrated in FIGURE 2 for several different switching frequencies, i.e., several different instantaneous input frequencies from source 11. The clamping action of the conducting transistor maintains the negative peaks at approximately the saturation voltage of the transistor. The amplitude of the positive peaks, and therefore the average DC value of the waveforms, varies in proportion to the impedance of tuned circuit 12.

Waveform A occurs when the transistor switches a signal from source 11 corresponding to the resonant frequency of tuned circuit 12, i.e., 4.4 megacycles. Waveforms B and C correspond to switching frequencies of 4.5 and 4.6 megacycles respectively. It is apparent that the average DC value of the collector waveform decreases as the switching frequency is further removed from the resonant frequency of tuned circuit 12.

Returning to FIGURE 1, an integrating capacitor 27, as 1000 picofarads, is coupled from the junction between load 13 and tuned circuit 12 to ground 15. Capacitor 27 filters out the FM signal and retains the average DC signal of the waveform. This signal across capacitor 27 varies with the intelligence contained in the FM signal, and therefore is the detected FM signal audio output.

Figure 3:
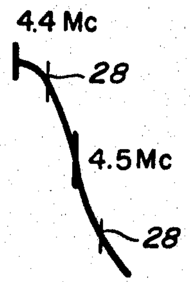
FIGURE 3 is a diagram of the response curve of the FM detector of FIGURE 1.

The resulting response curve for the FM detector is illustrated in FIGURE 3. Tuned circuit 12 has a resonant response with a peak at 4.4 megacycles and a slope substantially linear about a frequency of 4.5 megacycles. As the frequency of the incoming signal deviates about the carrier frequency, 4.5 megacycles, an output signal is developed across capacitor 27 whose value varies essentially linearly with the change in frequency of the incoming signal. Tuned circuit 12 is chosen to have a resonant frequency that causes the carrier frequency of the FM signal to fall along a substantially linear portion of the response curve. The maximum deviation of the FM signal, as seen in FIGURE 3 at points 28, should fall for the lower frequency side between the resonant peak of tuned circuit 12 and the carrier frequency.

A resistor 29, as 10 to 300 ohms, may be inserted in the series circuit to suppress harmonics generated by the transistor. For example, if the FM signal is intercarrier sound in a television receiver, the tenth harmonic, 45 megacycles, could interfere with the video signal. Resistor 29 eliminates this problem.

It will be observed that a low amplitude FM signal may switch a relatively large value of DC energy across the series circuit, providing an output signal of increased amplification.

Figure 4:
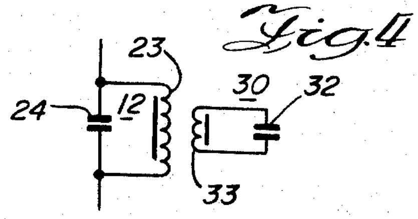
FIGURE 4 is a partial schematic diagram of a modification of the circuit of FIGURE 1.
Figure 5:
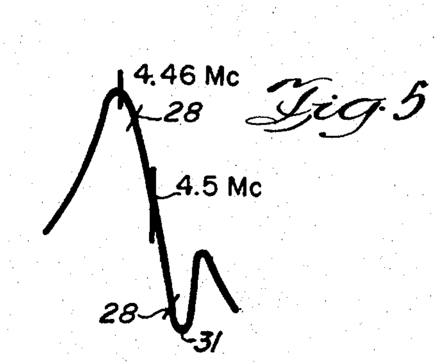
FIGURE 5 is a responsive curve for the modified FM detector illustrated in FIGURE 4.

In FIGURE 4, a modification of the circuit of FIGURE 1 is illustrated. The tuned circuit 12 is connected as illustrated in FIGURE 1. An absorption trap 30 is coupled to the parallel resonant circuit 12. Trap 30 is tuned to provide a minimum, or "zero," at point 31 along the response curve seen in FIGURE 5. In the embodiment illustrated, point 31 would correspond to 4.54 megacycles. This "zero" will cause the slope to be extremely linear about the carrier frequency, producing an output signal that more accurately represents the intelligence in the FM signal. The frequency of the resonant peak and the "zero" are chosen to allow the maximum deviation of the FM signal from the carrier frequency, at points 28, to fall along the linear portion of the slope.

Trap 30 may be formed from a capacitor 32 in series with an inductor 33. Inductor 33 and inductor 23 of tuned circuit 12 are mutually coupled, thereby providing the coupling between trap 30 and tuned circuit 12.

Figure 6:
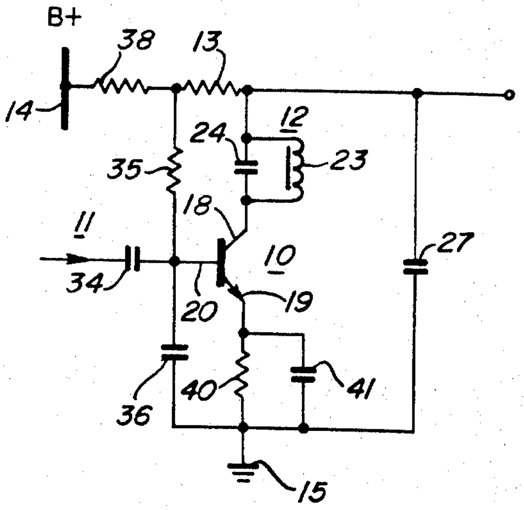
FIGURE 6 is a schematic diagram of another embodiment of the invention.

In FIGURE 6, another embodiment of the invention is illustrated. Transistor 10 is connected in a circuit similar to that of a common base oscillator. A 0.01 microfarad coupling capacitor 34 connects base 20 of the transistor to the source 11 of FM signal. Capacitor 34 forms a dynamic biasing network with a 470 kilohm resistor 35 and a 220 picofarad capacitor 36. Resistor 35 and load resistor 13, 39 kilohms, are connected through a 100 kilohm resistor 38 to a positive 150 volt potential on line 14.

The RC network at base 20 in conjunction with the base-emitter junction, acting as a diode, develops a base bias across capacitor 34 approximately equal to the peak of the input wave, allowing only the positive peaks of the signal to drive the transistor into conduction. The current pulses at the collector will tend to increase in amplitude as the input signal is increased. However, the width of the pulses will decrease. The fundamental component of the pulses remains essentially constant.

In this embodiment, emitter 19 is coupled to ground 15 through a regenerative feedback network comprising a paralleled 8.2 kilohm resistor 40 and an 820 picofarad capacitor 41. The value of capacitor 41 is significant in establishing the amount of regeneration and the level at which the circuit limits. As the capacitor is reduced in value, the voltage at which limiting occurs is reduced. Capacitor 41 must, however, be large enough to prevent oscillation.

The circuit of FIGURE 6 operates from a relatively high potential source of B+ and is suitable for use in conventional tube television signal receiver. The low voltage end of dropping resistor 38 also provides an extremely stable potential source which prevents voltage or temperature drift. Integrating capacitor 27 in conjunction with collector resistors 13 and 38 provides de-emphasis of the audio signal.

I claim:

1. An FM detector circuit comprising: a source of frequency modulated signal; tuned circuit means having a resonant peak; absorption trap means coupled to said tuned circuit and resonant at a trap frequency spaced from the frequency of said peak, said tuned circuit and trap having, between said frequencies, a frequency response with a linear slope; switching means having a control terminal and output terminals with conductive and nonconductive states therebetween; a source of DC energy; means connecting said tuned circuit means and said output terminals in a series circuit with said source of DC energy; and means connecting said source of signal to said control terminal for switching pulses of DC energy in said series circuit at the frequency of the signal, said tuned circuit and absorption trap being responsive to said pulses to produce in said series circuit a signal whose average DC value varies linearly about said slope with the frequency deviation of said frequency modulated signal.

2. A self-limiting FM detector circuit comprising: a source of signal frequency modulated about a carrier frequency by an intelligence signal; tuned circuit means hava resonant peak with a frequency response having a slope substantially linear about a frequency offset from the frequency of the peak and equal to said carrier frequency; a semiconductor device having a control terminal and output terminals with conductive and nonconductive states therebetween; a load; a source of DC energy; coupling means which allows bidirectional signal flow connecting said tuned circuit, said output terminals, and said load in series with said source of DC energy to form a frequency dependent voltage divider between said load and said tuned circuit; means connecting said source of signal to said control terminal for switching said DC energy across said series connected tuned circuit and load to generate a signal having a peak amplitude proportional to the deviation of the frequency modulated signal from the frequency of the resonant peak; and variable amplitude responsive means connected to said coupling means for developing thereacross a signal whose average DC level varies in proportion to the peak amplitude of said generated signal.

3. A self-limiting FM detector circuit comprising: a source of signal frequency modulated between a first and a second frequency by an intelligence varying signal; a paralleled capacitor and inductor forming a tuned circuit having a resonant peak with a frequency response having a substantially linear slope between said first frequency adjacent the frequency of said peak and said second frequency; a transistor having emitter, base and collector electrodes; a resistive load; a source of DC energy; means connecting the resistive load, the tuned circuit, the collector electrode, and the emitter electrode in series with said source of DC energy; means connecting said source of signal between said base and emitter electrodes for driving said transistor into saturation, switching said DC energy across said series connected tuned circuit and load; a resistor connected in said series circuit for suppressing harmonics generated when said transistor is driven into saturation; and an integrating capacitor coupled to a point between said tuned circuit and said load for developing thereacross a signal whose average amplitude varies with the frequency deviation of the signal.

4. A self-limiting FM detector circuit comprising: a source of signal frequency modulated between a first and a second frequency by an intelligence varying signal; a paralleled capacitor and inductor forming a tuned circuit having a resonant peak with a frequency response having a substantially linear slope between said first frequency adjacent the frequency of said peak and said second frequency; an absorption trap comprising a second capacitor and a second inductor coupled to the paralleled inductor and tuned to a frequency adjacent said second frequency and outside the substantially linear portion of the slope; a transistor having emitter, base and collector electrodes; a resistive load; a source of DC energy; means connecting the resistive load, the tuned circuit, the collector electrode, and the emitter electrode in series with said source of DC energy; means connecting said source of signal between said base and emitter electrodes for driving said transistor into saturation, switching said DC energy across said series connected tuned circuit and load; and an integrating capacitor coupled to a point between said tuned circuit and said load for developing thereacross a signal whose average amplitude varies with the frequency deviation of the signal.

5. A self-limiting FM detector circuit comprising: a source of signal frequency modulated between a first and a second frequency by an intelligence varying signal; a paralleled capacitor and inductor forming a tuned circuit having a resonant peak with a frequency response having a substantially linear slope between said first frequency adjacent the frequency of said peak and said second frequency; a transistor having emitter, base and collector electrodes; a resistive load; a source of DC energy; means connecting the resistive load, the tuned circuit, the collector electrode, and the emitter electrode in series with said source of DC energy; means connecting said source of signal between said base and emitter electrodes for driving said transistor into saturation, switching said DC energy across said series connected tuned circuit and load; a resistive-capacitive network coupled in series between said emitter electrode and said source of DC energy, the capacitive portion of said network having a value sufficient to prevent oscillations in said circuit in the absence of a frequency modulated signal; and an integrating capacitor coupled to a point between said tuned circuit and said load for developing thereacross a signal whose average amplitude varies with the frequency deviation of the signal.

References Cited

UNITED STATES PATENTS

| | | | |
|---|---|---|---|
| 2,344,678 | 3/1944 | Crosby | 329—110 X |
| 2,617,018 | 11/1952 | Hepp | 329—134 |
| 3,163,826 | 12/1964 | Kemper | 329—103 |
| 3,204,190 | 8/1965 | Broadhead | 329—103 X |
| 3,275,938 | 9/1966 | Carsello et al. | 325—349 |
| 3,290,613 | 12/1966 | Theriault | 329—134 X |

ALFRED L. BRODY, *Primary Examiner.*